(12) United States Patent
Fukazawa et al.

(10) Patent No.: US 7,560,144 B2
(45) Date of Patent: Jul. 14, 2009

(54) METHOD OF STABILIZING FILM QUALITY OF LOW-DIELECTRIC CONSTANT FILM

(75) Inventors: Atsuki Fukazawa, Tama (JP); Kiyoto Itoh, Tsuruoka (JP); Tsunayuki Kimura, Tama (JP); Nobuo Matsuki, Tama (JP)

(73) Assignee: ASM Japan K.K., Tokyo (JP)

( * ) Notice: Subject to any disclaimer, the term of this patent is extended or adjusted under 35 U.S.C. 154(b) by 723 days.

(21) Appl. No.: 11/086,598

(22) Filed: Mar. 22, 2005

(65) Prior Publication Data

US 2006/0216433 A1 Sep. 28, 2006

(51) Int. Cl.
*H05H 1/24* (2006.01)
(52) U.S. Cl. .................. 427/578; 427/569; 427/579
(58) Field of Classification Search .................. None
See application file for complete search history.

(56) References Cited

U.S. PATENT DOCUMENTS

| | | | |
|---|---|---|---|
| 5,439,524 A | | 8/1995 | Cain et al. |
| 5,494,522 A | * | 2/1996 | Moriya et al. ............... 118/719 |
| 5,628,869 A | * | 5/1997 | Mallon ....................... 438/694 |
| 5,695,566 A | * | 12/1997 | Suzuki et al. ............. 118/723 E |
| 5,804,089 A | | 9/1998 | Suzuki et al. |
| 5,925,226 A | | 7/1999 | Hurwitt et al. |
| 5,990,016 A | * | 11/1999 | Kim et al. ................... 438/707 |
| 6,228,438 B1 | | 5/2001 | Schmitt |
| 6,631,692 B1 | * | 10/2003 | Matsuki et al. .......... 118/723 E |
| 2002/0023590 A1 | | 2/2002 | Storbeck |
| 2004/0038514 A1 | * | 2/2004 | Hyodo et al. ............... 438/623 |

FOREIGN PATENT DOCUMENTS

| | | |
|---|---|---|
| JP | 9-320799 | 12/1997 |
| JP | 11-176593 | 7/1999 |
| JP | 11-229185 | 8/1999 |
| JP | 2000-269146 | 9/2000 |
| JP | 2003-45849 | 2/2003 |

* cited by examiner

*Primary Examiner*—Timothy Meeks
*Assistant Examiner*—Kelly M Stouffer
(74) *Attorney, Agent, or Firm*—Knobbe, Martens, Olson & Bear, LLP

(57) ABSTRACT

A method of forming a film having a low dielectric constant, comprises the steps of: placing a substrate between an upper electrode and a lower electrode inside a reaction chamber, introducing a silicon-containing hydrocarbon compound source gas, an additive gas, and an inert gas into a space between the upper and lower electrodes by controlling a gas flow ratio, generating a plasma by applying RF power to the space between the upper and lower electrodes in a state in which an interval between the upper electrode and the substrate is narrower in the vicinity of a center of the substrate than that in the vicinity of its periphery, and forming a film having a low dielectric constant on the substrate at a deposition rate of less than approx. 790 nm/min by controlling a flow rate of the process gas.

18 Claims, 5 Drawing Sheets
(3 of 5 Drawing Sheet(s) Filed in Color)

METHOD OF STABILIZING FILM QUALITY OF LOW-DIELECTRIC CONSTANT FILM

BACKGROUND OF THE INVENTION

1. Field of the Invention

The present invention relates to manufacturing semiconductor devices; particularly to a method of forming a low dielectric constant film having improved film strength by inhibiting plasma damage, using plasma CVD.

2. Description of the Related Art

Film formation on a semiconductor substrate by plasma chemical vapor deposition (a plasma CVD method) is carried out by placing a semiconductor substrate, which is a workpiece, on a resistance-heating type heater a temperature of which is raised to 50-550° C., in 1-10 Torr atmosphere. By disposing the heater by pairing with a shower-plate jetting out a reaction gas, a plasma is generated by radio-frequency discharge between the heater and the shower-plate by applying radio-frequency power at 13.56-60 MHz at an output of 100-4,000 W to the shower-plate.

Using plasma CVD methods, thin film formation of interlayer insulation films, passivation films, reflection prevention films, etc. is carried out. As progress in ultrafine semiconductor devices is accelerated, in order to solve a problem of increasing RC delays, Cu wiring having excellent thermal durability and low resistance is used in place of conventional Al wiring. A dielectric constant of an interlayer insulation film decreases as device design rules becomes smaller; for devices in the 130 nm generation, SiOF films having a dielectric constant of approx. 3.4-3.7 are used. Since devices have become less than 100 nm, dielectric constants of interlayer insulation films have run in under 3, and low-k films (low-k silicon-containing films) are used. Additionally, for the purpose of Cu diffusion prevention, SiC, etc. began to be used.

For low-k films and SiC films, either of a coating method or a plasma CVD method is used. By contrast with the former, which does not have problems such as damage, etc., in the case of plasma CVD, a semiconductor substrate is electrically affected because plasma discharge takes place between upper and lower electrodes. For existing SiH4-based oxide films, and oxide films such as TEOS films which use a liquid source, it is easy to obtain a relatively stable discharge. As semiconductor devices become ultrafine, films required contain carbon, and a stable discharge area becomes smaller as compared with that in conventional arts; and depending on an internal state of a reaction chamber, overpolymerization is accelerated, and pulverization may occur instead of film formation. In connection with overpolymerization, unstable elements including plasma fluctuation are increasing.

There are two modes of plasma damage, leakage current which a surface charge on a substrate passes to the grounding potential through a susceptor heater, and lateral leakage current which depends on in-plane surface potential distribution. In order to improve an issue of plasma damage due to electric discharge, conventionally, methods of improving insulation by anodizing an electrode, increasing a thickness of anodization, and precoating an electrode prior to thin film formation were used for the purpose of improving electrode insulation. There are concerns about problems regarding these methods, however, including the necessity for process gas tolerance, plasma tolerance, and thermotolerance, and precoat film exfoliation. Recently, these problems are improved by using an alloy material having excellent corrosion resistance and tolerance. An example of this improvement is disclosed in Japanese Patent Laid-open No. 1999-229185.

Additionally, a method of improving plasma damage by increasing a pressure during film formation and decreasing a radio-frequency plasma amount to be applied was used. In this case, change in film quality caused by change in process conditions becomes a problem. When a plasma amount to be applied is increased, sheath voltage is increased, causing damage on a semiconductor substrate. There are methods such as a method of reducing the damage by controlling sheath voltage without changing a plasma amount to be applied, which is disclosed in Japanese Patent Laid-open No. 2003-45849.

SUMMARY OF THE INVENTION

Using these conventional techniques, however, it is difficult to form a low dielectric constant film having stable film quality without plasma damage. It is thought that one of the causes for this is that these conventional techniques have not satisfactorily accomplished improvement of plasma fluctuation and unstable state.

As a dielectric constant is lowered along with accelerated progress in ultrafine semiconductor devices, mechanical strength of a film decreases, and because of this, problems related to integration and packaging occur. In order to bring improvement in these problems, in view of the time required, setting out of peripheral process conditions, etc., it is inclined to select relatively high dielectric constants for the 65-90 nm generation. Additionally, in order to lower a dielectric constant, there is the need for reducing a thickness of an interlayer insulation film on a wiring for which a low dielectric constant (low-k) film is used.

In an embodiment of the present invention, in consideration of these problems in the conventional techniques, one of the objects is to form a low dielectric constant film with controlled plasma damage and stable film quality. Additionally, in an embodiment, one of the objects is to form a low dielectric constant film having high mechanical strength stably. Further, in an embodiment, one of the objects is to provide an apparatus for accomplishing the above-mentioned objects. Additionally, in an embodiment, one of the objects is to provide a method of stabilizing a plasma inside a reactor.

In an embodiment achieving one or more above-mentioned objects, the present invention provides a method of forming a low-k film, which comprises the steps of: (I) Placing a substrate between an upper electrode and a lower electrode inside a reaction chamber, (II) introducing a silicon-containing hydrocarbon compound source gas, an additive gas, and an inert gas into a space between the upper and lower electrodes, (III) generating a plasma by applying RF power to the space between the upper and lower electrodes in a state in which an interval between the upper electrode and the substrate is narrower in the vicinity of a center of the substrate than that in the vicinity of its periphery, and (IV) forming a low-k film on the substrate at a deposition rate of less than approx. 790 nm/min (preferably, 750 nm/min or less) by controlling a flow rate of the gases.

The above-mentioned embodiment further includes at least the following aspects:

The method of forming a low-k film, wherein an interval between the vicinity of the center of the substrate and the upper electrode is approx. 70% to approx. 99% of an interval between the vicinity of the periphery of the substrate and the upper electrode.

The method of forming a low-k film, wherein a surface of the upper electrode, which faces the substrate, is convex, and a convex amount of the upper electrode surface is approx. 0.5 mm to approx. 6 mm.

The method of forming a low-k film, wherein the additive gas comprises a hydrogen/hydrocarbon additive gas and an oxidizing additive gas.

The method of forming a low-k film, wherein a flow rate of hydrogen/hydrocarbon additive gas is the same as or more than that of the source gas.

The method of forming a low-k film, wherein a flow rate of hydrogen/hydrocarbon additive gas is at least 1.5 times greater than that of the source gas.

The method of forming a low-k film, wherein a flow rate of oxidizing gas is the same or less than that of the source gas.

The method of forming a low-k film, wherein the source gas, A, the hydrogen/hydrocarbon-containing additive gas, B, the oxidizing gas, C, and the inert gas, D are introduced to between the upper and lower electrodes in a flow ratio of A:B:C:D=0.25-0.5:1-0.5:0.25-0.5:1.

The method of forming a low-k film, wherein a flow rate of the source gas is approx. 20 sccm to approx. 350 sccm; a flow rate of the hydrogen/hydrocarbon-containing additive gas is approx. 100 sccm to approx. 900 sccm; a flow rate of the oxidizing additive gas is approx. 25 sccm to approx. 300 sccm; and a flow rate of the inert gas is approx. 30 sccm to approx. 700 sccm.

The method of forming a low-k film, wherein the low-k film formed has no plasma damage, a hardness of 1.1 GPa or more, and a modulus of 6 GPa or more.

The method of forming a low-k film, wherein on the lower electrode, the substrate is placed, and a surface of the lower electrode, on which the substrate is placed, is concave and in contact with the vicinity of a periphery of the substrate.

The method of forming a low-k film, wherein a concave amount of the lower electrode surface is approx. 0.5 mm to approx. 2.0 mm.

The method of forming a low-k film, wherein the source gas is at least one silicon-containing hydrocarbon compound selected from the group consisting of the following compounds:

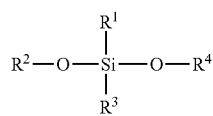

wherein $R^1$, $R^2$, $R^3$ and $R^4$ are independently any one of $CH_3$, $C_2H_5$, $C_3H_7$ and $C_6H_5$,

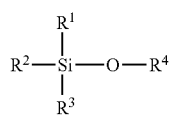

wherein $R^1$, $R^2$, $R^3$ and $R^4$ are independently any one of $CH_3$, $C_2H_5$, $C_3H_7$ and $C_6H_5$,

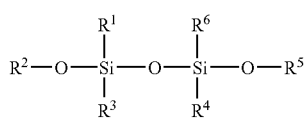

wherein $R^1$, $R^2$, $R^3$, $R^4$, $R^5$ and $R^6$ are independently any one of $CH_3$, $C_2H_5$, $C_3H_7$ and $C_6H_5$,

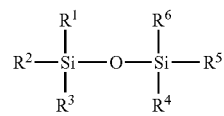

wherein $R^1$, $R^2$, $R^3$, $R^4$, $R^5$ and $R^6$ are independently any one of $CH_3$, $C_2H_5$, $C_3H_7$ and $C_6H_5$,

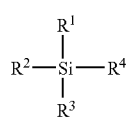

wherein $R^1$, $R^2$, $R^3$ and $R^4$ are independently any one of $CH_3$, $C_2H_5$, $C_3H_7$ and $C_6H_5$, and

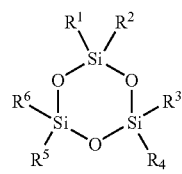

wherein $R^1$, $R^2$, $R^3$, $R^4$, $R^5$ and $R^6$ are independently any one of $CH_3$, $C_2H_5$, $C_3H_7$ and $C_6H_5$.

The method of forming a low-k film, wherein the hydrogen/hydrocarbon-containing additive gas is any one of $C_nH_{2n+2}$ (n is an integer of 1-5), $C_nH_{2n}$ (n is an integer of 1-5) and $C_nH_{2n+2}O$ (n is an integer of 1-5), or selected from any combination of the foregoing.

The method of forming a low-k film, wherein the oxidizing additive gas is any one of $O_2$, $O_3$, $CO_2$ and $H_2O$, or selected from any combination of the foregoing.

The method of forming a low-k film, wherein the inert gas is any one of He, Ar, Kr and Xe, or selected from any combination of the foregoing.

Additionally, in an alternative aspect, the present invention provides a method of forming a low-k film, which comprises the steps of: (I) Placing a substrate between an upper electrode and a lower electrode inside a reaction chamber, (II) introducing a silicon-containing hydrocarbon compound source gas A, a hydrogen/hydrocarbon-containing additive gas B, an oxidizing additive gas C, and an inert gas D into a space between the upper and lower electrodes in a flow ratio of A:B:C:D=0.25-0.5:1-0.5:0.25-0.5:1, (III) generating plasma by applying RF power to the space between the upper and lower electrodes, and (IV) forming a low-k film on the substrate at a deposition rate of less than approx. 790 nm/min (preferably, 750 nm/min or less).

The above-mentioned embodiment comprises at least the following aspects:

The method of forming a low-k film, wherein a flow rate of the source gas is approx. 20 sccm to approx. 350 sccm; a flow rate of the hydrogen/hydrocarbon-containing additive gas is approx. 100 sccm to approx. 900 sccm; a flow rate of the oxidizing additive gas is approx. 25 sccm to approx 300 sccm; and a flow rate of the inert gas is approx. 30 sccm to approx. 700 sccm.

The method of forming a low-k film, wherein the step of applying RF power to between the upper and the lower electrodes is carried out in a state in which an interval between the upper electrode and the substrate is narrower in the vicinity of the center of the substrate than that in the vicinity of its periphery.

The method of forming a low-k film, wherein the above-mentioned embodiment further includes all of aforesaid aspects (a shape of an electrode, film characteristics, usable silicon-containing hydrocarbon compounds, oxidizing gas, hydrogen/hydrocarbon additive gas, inert gas, etc.).

Additionally, any element used in an embodiment can interchangeably be used in another embodiment, and any combination of elements can be applied in these embodiments, unless it is not feasible. Additionally, it is to be understood that no necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

The present invention will now be described with reference to the drawings which are intended to illustrate an embodiment and not to limit the present invention. Additionally, the drawings are excessively simplified for illustration purposes. The patent or application file contains at least one drawing executed in color. Copies of this patent or patent application publication with color drawing(s) will be provided by the Office upon request and payment of the necessary fee.

FIGS. 4A and 4B show a charge-up state of a wafer before improvement (conventional techniques), and FIG. 4C shows a charge-up state of a wafer after the improvement.

FIG. 5A shows a state of dielectric breakdown before the improvement (conventional techniques), and FIG. 5B shows a state of dielectric breakdown after the improvement.

DETAILED DESCRIPTION OF THE PREFERRED EMBODIMENT

Figure 1:
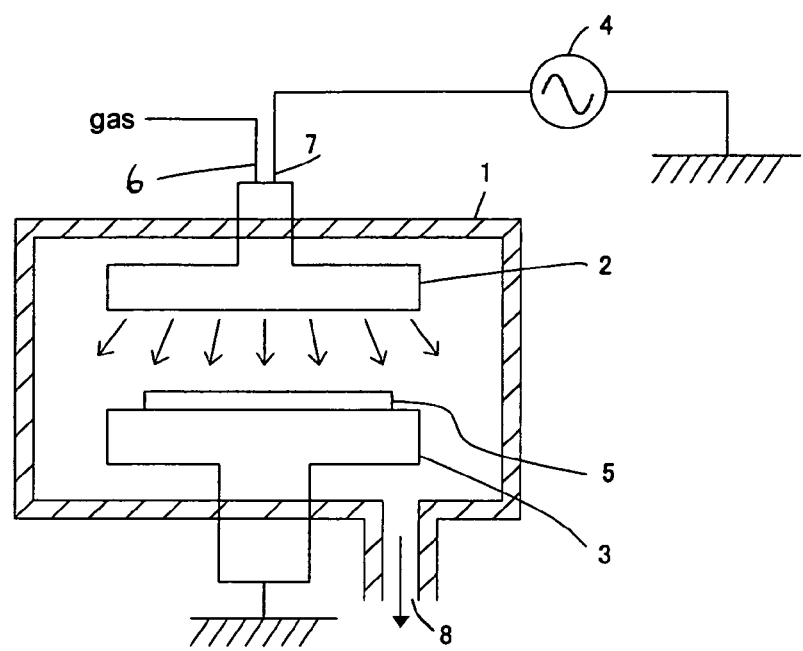
FIG. 1 is a schematic diagram showing one example of plasma CVD apparatus which can be used in the present invention.

In the process of forming a film on a semiconductor substrate, as general conditions in an embodiment, a semiconductor substrate, which is a workpiece, is placed on a resistance-heating type heater a temperature of which is raised to approx. 50° C. to approx. 550° C. in an atmosphere of approx. 1 Torr to approx. 30 Torr. By installing a shower-plate jetting out a reaction gas by pairing with the heater, and applying radio-frequency power at 13.5 MHz to 60 MHz, etc. to the shower-plate at an output of approx. 100 W to approx. 4,000 W, plasma discharge is formed between the heater and the shower-plate. For thin film formation, a silicon-containing insulation film formation material such as TEOS, $SiH_4$, and low-k materials, and an additive gas such as $CO_2$, $O_2$, and a HC-containing gas such as alcohol are used. As an inert gas which does not directly cause a chemical reaction, Ar, He, Kr or Xe is used. By decomposing the process gas introduced by the discharge, a thin film is formed on the semiconductor substrate.

Under the above-mentioned general conditions, depending on a plasma discharge state during silicon-containing insulation film formation, an overpolymerization state and plasma fluctuation occur, damaging an under layer transistor or interconnect wiring; due to this, a yield may considerably decrease. These are often the cases that are caused by an unstable state of plasma discharge. When plasma discharge is stabilized, no plasma bias occurs and a film is formed normally; in contrast, when plasma discharge is not stabilized, centralization of the plasma, and overpolymerization according to conditions, may occur. As sources of plasma instability, as mentioned above, a discharge interval and a relation with a film formation growth rate are important.

According to an embodiment of the present invention, a low-k film having high mechanical strength and controlled plasma damage can be formed. In other words, a film, which does not have a dielectric breakdown and is compact, but has stable film quality and a low dielectric constant, can be formed. Such improvement of film quality stability can be accomplished by controlling film formation so as not to induce plasma damage to a film and/or controlling the slowing down of a gas dissociation rate. The slowing down of a gas dissociation rate can be grasped generally as the slowing down of a deposition rate. In an embodiment, control so as not to induce plasma damage can be realized by adjusting an interval between an upper electrode and a substrate and/or adjusting a gas flow ratio of a source gas, an additive gas, an inert gas, etc. used. Additionally, in an embodiment, control of the slowing down of a gas dissociation rate can be realized by adjusting a gas flow ratio of a source gas, an additive gas, an inert gas, etc. used.

From the above-mentioned viewpoint, in an embodiment, film quality stability is realized by adjusting an interval between an upper electrode and a substrate and forming a film at a low deposition rate. Additionally, in an embodiment, film quality stability is realized by adjusting a flow ratio of a source gas, an additive gas, an inert gas, etc. used and forming a film at a low deposition rate. Additionally, in an embodiment, film quality stability is realized by adjusting an interval between an upper electrode and a substrate, adjusting a flow ratio of a source gas, an additive gas, an inert gas, etc. used, and forming a film at a low deposition rate.

A deposition rate used is less than approx. 790 nm/min (780 nm/min or less, 770 nm/min or less), preferably approx. 750 nm/min or less (including 700 nm/min or less, 600 nm/min or less, 500 nm/min or less, 400 nm/min or less, 300 nm/min or less).

Additionally, control of a gas dissociation rate can be normally grasped as control of a deposition rate; however, because gas dissociation occurs between the electrodes while deposition occurs on a substrate, the slowing down of a gas dissociation rate may not be unambiguously equal to the slowing down of a deposition rate due to an environment in the vicinity of a substrate, e.g., an electrostatic state of a substrate surface, a temperature difference between a substrate surface and the interior of a reactor, electromagnetic irradiation other than from RF power to a substrate surface, etc. However, by adjusting a deposition rate to the above-mentioned, plasma damage to a film can be substantially inhibited.

A deposition rate can be effectively controlled by adjusting the gas flow ratio of gases used (the process gas). However, other than this, a deposition rate can be adjusted to some extent. For example, by adjusting RF power, a pressure, a temperature, etc. (among them, particularly a pressure), a deposition rate can be adjusted.

In an embodiment, adjustment of the gas flow ratio of the process gas is implemented by overall reducing a gas flow rate under the above-mentioned conditions. Adjustment can be made, for example, by characteristically reducing flow rates of four different types of gases used for a process, a source gas, an oxidizing gas, a HC-containing additive gas (hydrogen/hydrocarbon additive gas), an inert gas (not necessary to use all these gases). A range of reduction is characterized in that an oxidizing additive gas and a source gas are reduced to ¼-½ and a HC-containing additive gas and an inert gas to ½-1. By applying a pressure of approx. 100-200 Pa in a state in which these ratios are maintained, a reaction state can be slowed down by controlling a deposition growth rate.

Although the above-mentioned reduction range differs according to a standard flow rate, in an embodiment, a gas flow rate is adjusted so as to obtain the following range: A source gas A, a hydrogen/hydrocarbon additive gas B, an oxidizing additive gas C, and an inert gas D are introduced to between upper and lower electrodes in the ratio of A:B:C:D=0.25-0.5:1-0.5:0.25-0.5:0.5-1.5. Additionally, preferably the inert gas is 1 in the above-mentioned ratio, and ratios of other gases are in proportion to the inert gas being 1. Additionally, in an embodiment not using an oxidizing additive gas, a ratio of the oxidizing additive gas is zero; consequently, the above-mentioned ratio includes zero when the applicable gas is not used. As specific flow rates, in an embodiment, a flow rate of the source gas is from approx. 20sccm to approx. 350 sccm (including 50 sccm, 100 sccm, 150 sccm, 200 sccm, 300 sccm, and values between the foregoing); a flow rate of the hydrogen/hydrocarbon additive gas is from approx. 100 sccm to approx. 900 sccm (including 200 sccm, 300 sccm, 400 sccm, 500 sccm, 600 sccm, 700 sccm, 800 sccm, and values between the foregoing); a flow rate of the oxidizing additive gas is from approx. 25 sccm to approx. 300 sccm (including 50 sccm, 100 sccm, 150 sccm, 200 sccm, 300 sccm, and values between the foregoing); a flow rate of the inert gas is from approx. 30 sccm to approx. 700 sccm (50 sccm, 100 sccm, 200 sccm, 300 sccm 400 sccm, 500 sccm, 600 sccm, and values between the foregoing).

Additionally, in an embodiment, a flow rate of a hydrogen/hydrocarbon additive gas is the same or more than that of a source gas; in an embodiment, a flow rate of a hydrogen/hydrocarbon additive gas is 1.5 times or more than that of a source gas. Additionally, in an embodiment, a flow rate of an oxidizing gas is the same flow rate or less than that of a source gas.

By slowing down a deposition growth rate as described above, stabilizing plasma discharge becomes possible; and it has been verified that by inhibiting unstable discharge in this manner, plasma damage is considerably improved.

In an embodiment of the present invention, as a source gas, a silicon-containing hydrocarbon compound can be used. For example, compounds disclosed in U.S. Pat. No. 6,455,445 and U.S. Patent Application No. 2004/0038514 assigned to the same assignees as this application (the disclosure of the patent and the publication is incorporated herein by reference in their entirety) can be used. The source gas may be a silicon-containing hydrocarbon compound having a general formula $Si_aO_bC_xH_y$ (wherein a, b, x, y are any integers); specifically, compounds shown below can be mentioned. However, the present invention is not limited to these compounds.

Chemical formula A

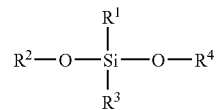

wherein, R1, R2, R3 and R4 are independently any one of $CH_3$, $C_2H_5$, $C_3H_7$, $C_6H_5$.

Chemical formula B

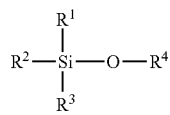

wherein, R1, R2, R3 and R4 are independently any one of $CH_3$, $C_2H_5$, $C_3H_7$, $C_6H_5$.

Chemical formula C

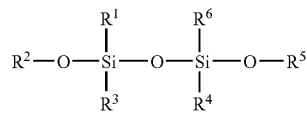

wherein, R1, R2, R3, R4, R5 and R6 are independently any one of $CH_3$, $C_2H_5$, $C_3H_7$, $C_6H_5$.

Chemical formula D

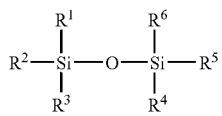

wherein, R1, R2, R3, R4, R5 and R6 are independently any one of $CH_3$, $C_2H_5$, $C_3H_7$, $C_6H_5$.

Chemical formula E

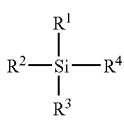

wherein, R1, R2, R3 and R4 are independently any one of $CH_3$, $C_2H_5$, $C_3H_7$, $C_6H_5$.

Chemical formula F

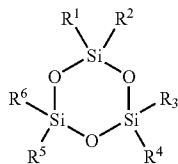

wherein, R1, R2, R3, R4, R5 and R6 are independently any one of $CH_3$, $C_2H_5$, $C_3H_7$, $C_6H_5$.

Any one of the compounds shown above or any combination of the foregoing can be used.

An additive gas here means a hydrogen/hydrocarbon-containing additive gas, and/or an oxidizing gas; and any gas or a combination of gases, which have oxidizing, reducing and nitriding actions, can be used.

As an inert gas, any one or any combination of He, Ar, Kr and Xe can be used. Because these gases vary in ionization energy and a collision cross section, a reaction in vapor phase can be controlled by altering a combination of these gases.

As an oxidizing gas, oxygen ($O_2$), carbon oxide ($CO_2$), water ($H_2O$), ozone ($O_3$), carbon monoxide ($N_2O$), and etc. can be mentioned. Ozone ($O_3$) has a strong oxidizing action, whereas carbon oxide ($CO_2$) and carbon monoxide ($N_2O$) have a weak oxidizing action. A gas type and an amount used are selected properly according to the intended use.

As hydrogen/hydrocarbon additive gas, any one of hydrogen ($H_2$), $C_nH_{2n+2}$ (n is an integer of 1-5), $C_nH_{2n}$, (n is an integer of 1-5), $C_nH_{2n+1}OH$ (n is an integer of 1-5) or any combination of the foregoing is selected according to the intended use. When a large amount of hydrogen-containing additive gas is used, attention to a mixing ratio of the process gas becomes necessary because thermostability of a film tends to worsen.

Additionally, in order to verify plasma damage made to a film, using a pattern wafer (antenna TEG wafer) in which a gate oxidized film of 4 nm thick is formed on a poly-Si transistor, a dielectric breakdown state caused to the gate oxidizing film during film formation by plasma CVD can be verified. Using this sample, it is seen that when plasma damage was induced during film formation by CVD, electric charge got into the gate, thereby causing a dielectric breakdown. Verifying a dielectric breakdown state is done by leakage current evaluation. By examining whether leakage current is present at each in-plane measuring point (for example, 56 points) or not, evaluation is made by the number of points without presence of leakage current/total measuring points ("TEG yield"); based on a standard value, whether it is non-defective or defective can be differentiated. When all the measuring points of the antenna TEG wafer are non-defective, it can be determined that the TEG yield is 100%, and no plasma damage has been induced.

Additionally, by controlling a deposition growth rate, forming a film having high density and a low dielectric constant becomes possible, and it is possible to improve mechanical strength and to lower a dielectric constant at the same time.

Stabilization of plasma is also involved in a discharge interval. For example, a deposition growth rate is also affected by a discharge interval. By increasing this interval, it is possible to accelerate lowering of a dielectric constant. However, due to an overpolymerization state, film formation easily goes into a state in which film formation is impossible. In this state, plasma is unstable, thereby creating one of the causes for plasma damage. Because it is often the case that an overpolymerization state occurs from a center portion when plasma is ignited, it is effective to avoid instability when plasma is ignited. As a method of avoiding it, in an embodiment, by stabilizing a discharge state by giving a convex shape to an upper electrode and decreasing a discharge interval in a center portion, plasma is stabilized.

Figure 2:
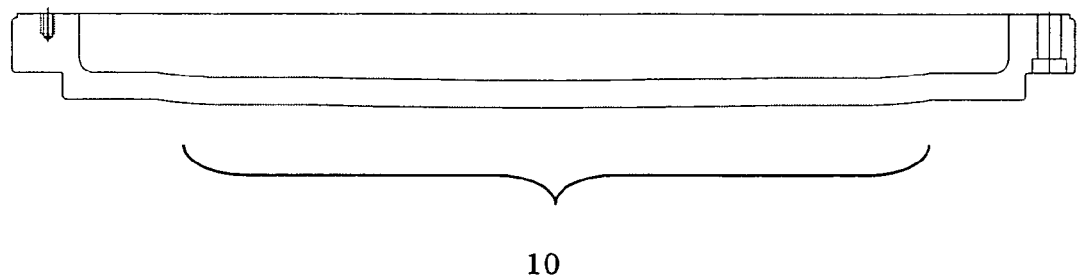
FIG. 2 is a schematic section showing a shape of a shower-plate in an embodiment of the present invention.

An interval between the upper electrode and a substrate is, for example, approx. 20 mm to approx. 28 mm. In an embodiment, it can be in the range of approx. 10 mm to approx. 50 mm. If the interval is at this level, for a convex amount, in an embodiment, a proper amount is selected from approx. 0.5 mm to approx. 6 mm (including 1 mm, 2 mm, 3 mm, 4 mm, 5 mm, and values between the foregoing) for the center portion as compared with the periphery. A shape of a convex region is not particularly limited, but an area ratio (a transformation ratio) of the convex region to a front area of the upper electrode facing the lower electrode is 20-99% (including 30%, 40%, 50%, 60%, 70%, 80%, 90%, and values between the foregoing; preferably 70-99%) in an embodiment, and a convex surface may be constructed to be a spherical surface, a curved surface, a truncated cone, etc.; preferably a gently curved surface. Additionally, in an embodiment, a convex shape is formed concentrically with the upper electrode. Additionally, in an embodiment, an area of the convex region is larger than that of a substrate. For example, when a φ200 mm wafer is treated (a surface area of approx. 31,400 mm2), and a convex surface is a curved surface, the convex region should be approx. 35,000 mm2 (approx. 10-20% larger). An example of the upper electrode is shown in FIG. 2. In this example, a convex region 10 is a gently curved surface, and a curvature of the vicinity of the periphery of the convex region is larger than that of the vicinity of the center. Additionally, in FIG. 2, gas discharge fine pores are omitted.

With the above-mentioned result, in an embodiment, an interval between the vicinity of the center of a substrate and an upper electrode is approx. 70% to approx. 99% (including 75%, 80%, 85%, 90%, 95%, and values between the foregoing) of an interval between the vicinity of the periphery of the substrate and the upper electrode. It is verified that as a convex amount is increased, a plasma state goes in a stabilization direction.

Figure 3:
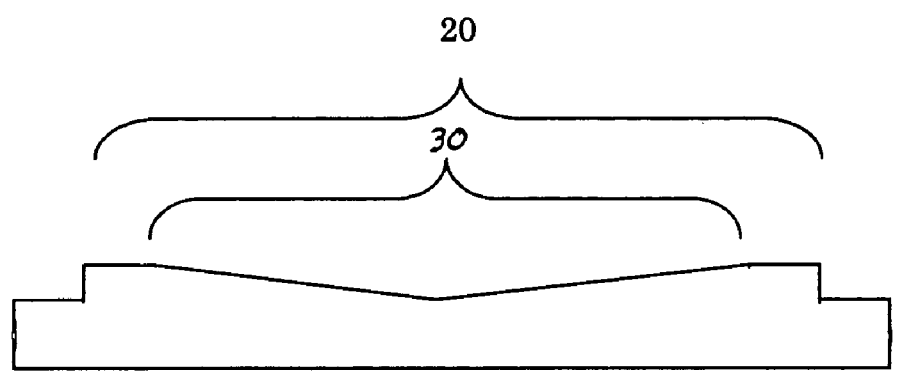
FIG. 3 is a schematic section showing a shape of a lower electrode in an embodiment of the present invention.

Additionally, by combining with the above-mentioned upper electrode, or solely, a lower electrode having a concave substrate-supporting surface can be used. A concave type lower electrode is effective to improve film uniformity and as a countermeasure against particles to be accumulated on a backside of a substrate. In an embodiment, as a concave amount of the lower electrode, a proper value can be selected from approx. 0.5 mm to approx. 2 mm (including 1 mm, 1.5 mm, and values between the foregoing). As a concave type lower electrode, for example, the lower electrode disclosed in U.S. Pat. No. 6,631,692B1 can be used (the disclosure of the patent and the publication is incorporated herein by reference in their entirety) Additionally, in FIG. 3, an example of a concave type lower electrode is shown. This lower electrode has a concave region 30 of approx. 12,000 mm2, and is entirely made of aluminum, and its surface is anodized. An area of a wafer-supporting portion 20 is approx. 20,000 mm2.

In order to stabilize plasma discharge, it is effective to combine flow rate control for the process gas and the upper electrode. By implementing these details, with a dielectric constant being maintained, for example, in the range of 2.4 to 3.1, mechanical strength, for example, of 8 to 30 GPa, and an antenna TEG yield of 100% can be achieved; and, occurrence of plasma damage during film formation can be substantially stopped. Additionally, in an embodiment, a low-k film formed has the TEG yield of 100%, hardness of 1.1 GPa or more, modulus of 6 GPa or more.

Embodiments of the present invention will now be described with reference to the drawings of preferred embodiments which are intended to illustrate and not to limit the invention.

FIG. 1 is a schematic diagram of a plasma CVD apparatus used in an embodiment of the present invention. The plasma CVD apparatus comprises a reaction chamber 1, an upper electrode 2, a lower electrode 3, a gas inlet port 6, and a radio-frequency (RF) introducing portion 7. The upper and lower electrodes are disposed facing and parallel to each other, and both are heated by respective heaters buried in. A semiconductor substrate, which is a workpiece, is placed on the lower electrode, and heated and supported. A number of fine pores are provided at a bottom face of the upper electrode, from which a gas is jetted out to the semiconductor substrate 5. Radio-frequency power is supplied from an external radio-frequency generator 4, and the gas inlet port 5 and the RF introducing portion 7 are electrically insulated.

A low-k silicon-containing film is formed on a semiconductor workpiece by process gas introduced into the reactor and plasma generated by RF power applied.

In order to achieving stability during plasma discharge, by slowing down a dissociation rate by giving a convex shape to the upper electrode 2 and a concave shape to the lower electrode, reducing a flow rate of process gas and an amount of RF power applied, and pressure control, plasma stability is achieved, and a low-k film without plasma damage and having high density and high strength is formed. A film formed by this method has a low dielectric constant, excellent mechanical strength and no plasma damage. In examples described later, a CVD apparatus in which a shape transformation area of an upper electrode is 35,000 mm2 and a shape transformation area of a lower electrode is 12,000 mm2 was used.

When an insulation film is formed on a semiconductor substrate, with the semiconductor substrate being supported inside a reactor, gas inside the reactor is exhausted from an exhaust port 8, and is replaced by a mixture gas of a reducing gas and an inert gas. By replacing the gas inside the reactor by a mixture gas, a residue inside the reactor can be eliminated; and by preventing the residue from going around to a transfer system, a clean state can be maintained at all times.

EXAMPLES

Examples of the present invention will now be described, but the present invention is not limited to these examples. Conditions and results of each example are as described below. Additionally, an apparatus shown in FIG. 1 was used; a convex type upper electrode shown in FIG. 2 and a concave lower electrode shown in FIG. 3 were used.

Example 1

A State Before the Improvement

Workpiece: Low-k silicon insulation film
Upper electrode: Flat
Lower electrode: Flat (The entire surface is in contact.)
DM-DMOS: 200 sccm
He: 140 sccm
Isopropyl alcohol: 400 sccm
O2: 200 sccm
Pressure: 800 Pa
Heat treatment temperature: 380° C.
Deposition growth rate: 800 nm/min
Dielectric constant: 2.6
Hardness: 1.0 GPa
Modulus: 6 GPa
Antenna TEG yield: 60%

Example 2

Workpiece: Low-k silicon insulation film
Upper electrode: 1 mm convex type
Lower electrode: 0.5mm concave type
DM-DMOS: 200 sccm
He: 140 sccm
Isopropyl alcohol: 400 sccm
O2: 200 sccm
Pressure: 800 Pa
Heat treatment temperature: 380° C.
Deposition growth rate: 790 nm/min
Dielectric constant: 2.6
Hardness: 1.0 GPa
Modulus: 6 GPa
Antenna TEG yield: 80%

Example 3

Workpiece: Low-k silicon insulation film
Upper electrode: 3.0 mm convex type
Lower electrode: 0.5 mm concave type
DM-DMOS: 200 sccm
He: 140 sccm
Isopropyl alcohol: 400 sccm
O2: 100 sccm
Pressure: 600 Pa
Heat treatment temperature: 380° C.
Dielectric constant: 2.62
Deposition growth rate: 750 nm/min
Hardness: 1.1 GPa
Modulus: 7 GPa
Antenna TEG yield: 100%

Example 4

Workpiece: Low-k silicon insulation film
Upper electrode: 1 mm convex type
Lower electrode: 0.5 mm concave type
DM-DMOS: 100 sccm
He: 140 sccm
Isopropyl alcohol: 400 sccm
O2: 100 sccm
Pressure: 600 Pa
Heat treatment temperature: 380° C.
Dielectric constant: 2.62
Deposition growth rate: 450 nm/min
Hardness: 1.2 GPa
Modulus: 8 GPa
Antenna TEG yield: 100%

Example 5

Workpiece: Low-k silicon insulation film
Upper electrode: 3 mm convex type
Lower electrode: 0.5 mm concave type
DMOTMDS :250 sccm
He: 200 sccm
Isopropyl alcohol: 400 sccm
O2: 150 sccm Heat treatment temperature: 400° C.
Pressure: 800 Pa
Deposition growth rate: 900 nm/min
Dielectric constant: 2.5
Hardness: 1.0 GPa
Modulus: 5.5GPa
Antenna TEG yield: 70%

Example 6

Workpiece: Low-k silicon insulation film
Upper electrode: 6 mm convex type
Lower electrode: 0.5 mm concave type
DMOTMDS :250 sccm
He: 200 sccm
Isopropyl alcohol: 400 sccm
O2: 150 sccm
Pressure: 800 Pa
Heat treatment temperature: 400° C.
Deposition growth rate: 700 nm/min
Dielectric constant: 2.5
Hardness: 1.0 GPa
Modulus: 5.5 GPa
Antenna TEG yield: 100%

Example 7

Workpiece: Low-k silicon insulation film
Upper electrode: 3 mm convex type
Lower electrode: 0.5 mm concave type
DMOTMDS: 125 sccm
He: 200 sccm
Isopropyl alcohol: 400 sccm
O2: 75 sccm
Pressure: 600 Pa
Heat treatment temperature: 400° C.
Deposition growth rate: 640 nm/min
Dielectric constant: 2.52
Hardness: 1.2 GPa
Modulus: 8 GPa
Antenna TEG yield: 100%

Example 8

Workpiece: Low-k silicon insulation film
Upper electrode: 1.5 mm convex type
Lower electrode: 0.5 mm concave type
DMOTMDS :63 sccm
He: 100 sccm
Isopropyl alcohol: 200 sccm
O2: 37 sccm
Pressure: 600 Pa
Heat treatment temperature: 400° C.
Deposition growth rate: 450 nm/min
Dielectric constant: 2.51
Hardness: 1.1 GPa
Modulus: 6 GPa
Antenna TEG yield: 100%

Summarizing the above in a table is as follows:

| Example | Dielectric Constant | Deposition Growth Rate (nm/min) | Hardness (GPa) | Modulus (GPa) | Electrode Shape Convex mm/ Concave mm Upper/Lower | TEG Yield (%) | Comment |
|---|---|---|---|---|---|---|---|
| 1 | 2.6 | 800 | 1.0 | 6 | Flat/0.5 | 60 | Default |
| 2 | 2.6 | 790 | 1.0 | 6 | 1/0.5 | 80 | Upper electrode shape dependent |
| 3 | 2.59 | 750 | 1.1 | 7 | 3/0.5 | 100 | Upper electrode shape dependent |
| 4 | 2.61 | 450 | 1.2 | 8 | 1/0.5 | 100 | Flow rates of oxidizing gas, source gas reduced by ½ |
| 5 | 2.5 | 900 | 1.0 | 5.5 | 3/0.5 | 70 | Default |
| 6 | 2.51 | 750 | 1.1 | 6 | 6/0.5 | 100 | Upper electrode shape dependent |
| 7 | 2.52 | 640 | 1.2 | 8 | 3/0.5 | 100 | Flow rates of oxidizing gas, source gas reduced by ½ |
| 8 | 2.51 | 450 | 1.4 | 10 | 1.5/0.5 | 100 | Flow rates of oxidizing gas, source gas reduced by ¼; Flow rates of inert gas, HC-containing additive gas reduced by ½ |

Dielectric constants verified this time in the examples were in the range of 2.5-2.7, which is required for the 65 nm generation. Further, by digitizing the effects from the slowing down of a deposition growth rate implemented using the respective combinations, it was verified that by making a deposition growth rate preferably 750 mm or less, formation of a film without plasma damage and having a low dielectric constant and high strength became possible. Additionally, because a wiring height will become smaller as semiconductor devices will become ultrafine, this process technique is highly competitive in order to improve deposition controllability as well.

Figure 4A:
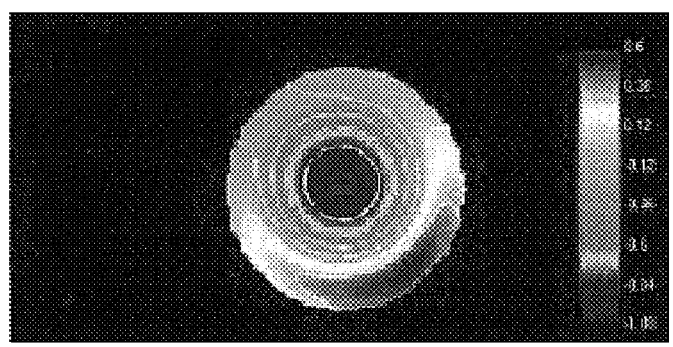
FIGS. 4A, 4B and 4C are color screens showing leakage current distribution by a noncontact electrical property evaluator.
Figure 4B:
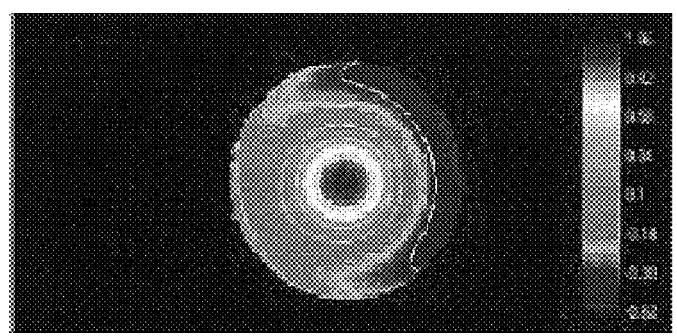
Figure 4C:
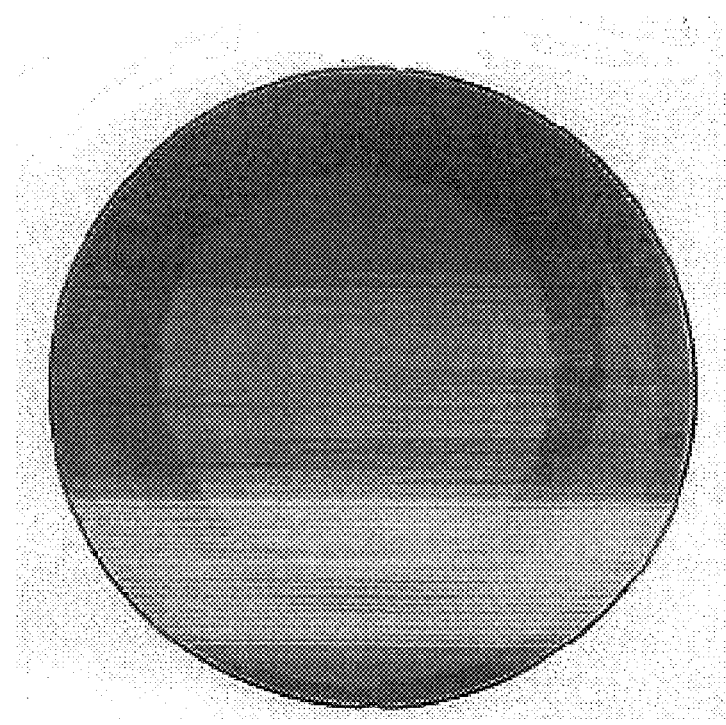
Figure 5A:
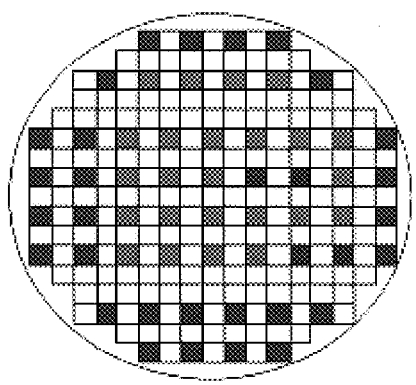
FIGS. 5A and 5B are figures for verifying presence of plasma damage.
Figure 5B:
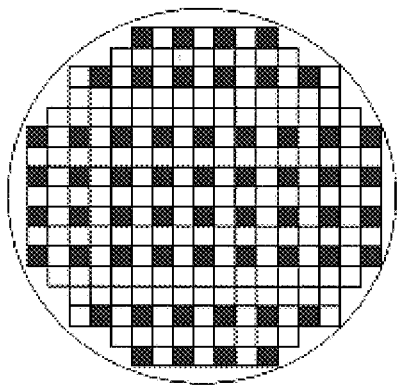

Further, the results of measuring a TEG yield under conditions of Example 1 and Example 4 and using the antenna TEG wafer are shown in FIG. 5A and FIG. 5B respectively. Red regions are areas having high leakage current values and dielectric breakdown; blue regions are areas having low leakage current values and no damage induced. Additionally, FIGS. 4A-4C are figures showing leakage current distribution, and color copies of display screens obtained by a non-contact electrical property evaluator; FIGS. 4A (k=2.4) and 4B (k=2.7) show leakage current distribution by a conventional technique (conditions corresponding to FIG. 5A); FIG. 4C shows leakage current distribution of a wafer formed under the same conditions as those used for FIG. 5B. In this figure, red shows a state positively charged; and purple shows a state negatively charged. In FIGS. 4A and 4B and in FIG. 4C, color distribution is reversed. This is not fundamental difference (depending on films, a center portion becomes negative or positive.); whether color difference between a center portion and the periphery is large or not becomes an issue. In FIGS. 4A and 4B, it is seen that color difference is large, i.e., charge difference is large, electricity passes laterally in a plane, and dielectric breakdown easily occurs.

The above-mentioned embodiments do not limit the present invention, but are intended to explain preferred embodiments of the present invention. At least one aspect is a method of improving film strength by avoiding plasma instability to reduce plasma damage using a capacitively-coupled plasma generator, which is characterized in that a deposition growth rate is reduced by decreasing a flow rate of process gas in a given ratio and lowering a pressure in order to control a deposition growth rate of a film formed by plasma CVD using a silicon-containing hydrocarbon compound expressed by a general formula $Si_aO_bC_xH_y$ (wherein a, b, x, y are arbitrary integers) as a source gas. Additionally, in an embodiment, control of a discharge interval is characterized in that plasma instability is avoided by using a convex type upper electrode and a concave type lower electrode, not by using a gas flow ratio. In an alternative embodiment, by combining control of a flow ratio of process gas and adjusting a discharge interval, plasma damage is substantially completely eliminated, thereby making it possible to achieve high film strength.

What is claimed is:

1. A method of forming a film having a low dielectric constant, which comprises the steps of:
   (i) placing a substrate between an upper electrode and a lower electrode inside a reaction chamber;
   (ii) introducing a silicon-containing hydrocarbon compound source gas, an additive gas, and an inert gas into a space between said upper and lower electrodes;
   (iii) generating a plasma by applying RF power to the space between said upper and lower electrodes;
   (iv) forming a low dielectric constant film on said substrate at a deposition rate of approx. 790 nm/mm or higher;
   (v) detecting plasma damage occurring in the low dielectric constant film on the substrate;
   (vi) as a result of detecting the plasma damage, narrowing an interval between the upper electrode and the substrate more in the vicinity of a center of the substrate than that in the vicinity of its periphery in step (iii) for forming a subsequent low dielectric constant film on a substrate, wherein a surface of the upper electrode facing the substrate is convex, and a surface of the lower electrode is concave and in contact with the vicinity of a periphery of the substrate, wherein a convex amount of the upper electrode surface is greater than a concave amount of the lower electrode; and
   (vii) performing steps (i) to (iv) for the subsequent low dielectric constant film on the substrate, wherein the deposition rate is reduced to less than 790 nm/mm as a result of the narrowing of the interval, thereby inhibiting the occurrence of plasma damage.

2. The method according to claim 1, wherein an interval between the vicinity of the center of said substrate and said upper electrode in step (vi) is approx. 70% to approx. 99% of an interval between the vicinity of the periphery of said substrate and said upper electrode.

3. The method according to claim 2, wherein a surface of said upper electrode, which faces said substrate, is convex, and a convex amount of said upper electrode surface is approx. 0.5 mm to approx. 6 mm.

4. The method according to claim 1, wherein in step (ii) for the subsequent low dielectric constant film, said additive gas comprises a hydrogen/hydrocarbon additive gas and an oxidizing additive gas.

5. The method according to claim 4, wherein a flow rate of said hydrogen/hydrocarbon additive gas is the same as or more than that of said source gas.

6. The method according to claim 5, wherein a flow rate of said hydrogen/hydrocarbon additive gas is at least 1.5 times greater than that of said source gas.

7. The method according to claim 4, wherein a flow rate of said oxidizing gas is the same as or less than that of said source gas.

8. The method according to claim 4, wherein said source gas, A, said hydrogen/hydrocarbon-containing additive gas, B, said oxidizing gas, C, and said inert gas, D, are introduced to between said upper and lower electrodes in a flow ratio of A:B:C:D=0.25-0.5:1-0.5:0.25-0.5:1.

9. The method according to claim 8, wherein a flow rate of said source gas is approx. 20 sccm to approx. 350 sccm; a flow rate of said hydrogen/hydrocarbon-containing additive gas is approx. 100 sccm to approx. 900 sccm; a flow rate of said oxidizing additive gas is approx. 25 sccm to approx. 300 sccm; and a flow rate of said inert gas is approx. 30 sccm to approx. 700 sccm.

10. The method according to claim 1, wherein said formed subsequent film having a low dielectric constant has no plasma damage, a hardness of 1.1 GPa or more, and a modulus of 6 GPa or more.

11. The method according to claim 1, wherein in step (vi), a concave amount of said lower electrode surface is approx. 0.5 mm to approx. 2.0 mm.

12. The method according to claim 1, wherein in step (ii) for the subsequent low dielectric constant film, said source gas is at least one silicon-containing hydrocarbon compound selected from the group consisting of the following compounds:

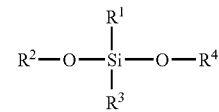

wherein $R^1$, $R^2$, $R^3$ and $R^4$ are independently any one of $CH_3$, $C_2H_5$, $C_3H_7$, $C_6H_5$,

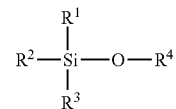

wherein $R^1$, $R^2$, $R^3$ and $R^4$ are independently any one of $CH_3$, $C_2H_5$, $C_3H_6$, $C_6H_5$,

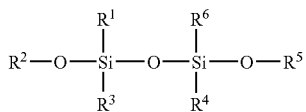

wherein $R^1, R^2, R^3, R^4, R^5$, and $R^6$ are independently any one of $CH_3, C_2H_5, C_3H_7, C_6H_5$,

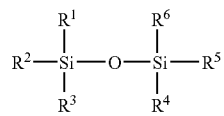

wherein $R^1, R^2, R^3, R^4, R^5$, and $R^6$ are independently any one of $CH_3, C_2H_5, C_3H_7, C_6H_5$,

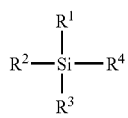

wherein $R^1, R^2, R^3$, and $R^4$ are independently any one of $CH_3, C_2H_5, C_3H_7, C_6H_5$, and

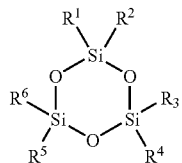

wherein, $R^1, R^2, R^3, R^4, R^5$, and $R^6$ are independently any one of $CH_3, C_2H_5, C_3H_7, C_6H_5$.

13. The method according to claim 4, wherein said hydrogen/hydrocarbon-containing additive gas is any one of $C_nH_{2n+2}$ (n is an integer of 1-5), $C_nH_{2n}$ (n is an integer of 1-5), and $C_nH_{2n+2}$ (n is an integer of 1-5), or selected from any combination of the foregoing.

14. The method according to claim 4, wherein said oxidizing additive gas is any one of $O_2$, $O_3$, $CO_2$ and $H_2O$, or selected from any combination of the foregoing.

15. The method according to claim 1, wherein in step (ii) for the subsequent low dielectric constant film, said inert gas is any one of He, Ar, Kr and Xe, or selected from any combination of the foregoing.

16. The method according to claim 1, wherein in step (vi), an area of the convex portion of the upper electrode is greater than an area of the substrate.

17. A method for inhibiting the occurrence of plasma damage to an interlayer insulation film in a method of forming the interlayer insulation film comprising: (i) placing a substrate between an upper electrode and a lower electrode inside a reaction chamber; (ii) introducing a silicon-containing hydrocarbon compound source gas, an additive gas, and an inert gas into a space between the upper and lower electrodes; (iii) generating a plasma by applying RF power to the space between the upper and lower electrodes; and (iv) forming an interlayer insulation film on the substrate at a deposition rate of 790 nm/min or higher, said method comprising:

detecting plasma damage occurring in the interlayer insulation film on the substrate;

as a result of detecting the plasma damage, narrowing an interval between the upper electrode and the substrate more in the vicinity of a center of the substrate than that in the vicinity of its periphery in step (iii) for forming a subsequent interlayer insulation film on a substrate; and performing steps (i) to (iv) for the subsequent interlayer insulation film on the substrate, wherein the deposition rate is reduced to less than 790 nm/mm as a result of the narrowing of the interval, thereby inhibiting the occurrence of plasma damage, wherein a surface of the upper electrode facing the substrate is convex, and a surface of the lower electrode is concave and in contact with the vicinity of a periphery of the substrate, wherein a convex amount of the upper electrode surface is greater than a concave amount of the lower electrode.

18. The method according to claim 17, wherein the convex amount of the upper electrode surface is approx. 0.5 mm to approx. 6 mm.

* * * * *